(12) United States Patent
Watanabe (10) Patent No.: US 10,218,169 B2
(45) Date of Patent: Feb. 26, 2019

(54) OVERHEAT PROTECTION UNIT

(71) Applicant: DENSO CORPORATION, Kariya, Aichi-pref. (JP)

(72) Inventor: Taichi Watanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 200 days.

(21) Appl. No.: 15/426,134

(22) Filed: Feb. 7, 2017

(65) Prior Publication Data

US 2017/0244240 A1 Aug. 24, 2017

(30) Foreign Application Priority Data

Feb. 24, 2016 (JP) .................................. 2016-033521

(51) Int. Cl.
*H02H 7/20* (2006.01)
*H03K 7/08* (2006.01)
*H03K 17/082* (2006.01)
*H03K 17/08* (2006.01)

(52) U.S. Cl.
CPC .............. *H02H 7/205* (2013.01); *H03K 7/08* (2013.01); *H03K 17/082* (2013.01); *H03K 2017/0806* (2013.01)

(58) Field of Classification Search
CPC ......... H02H 7/205; H03K 7/08; H03K 17/082
See application file for complete search history.

(56) References Cited

U.S. PATENT DOCUMENTS

| 7,499,253 | B2 * | 3/2009 | Hirata | H02H 3/025 361/103 |
| 8,947,064 | B2 * | 2/2015 | Feldtkeller | H02H 5/048 323/279 |
| 9,377,831 | B2 * | 6/2016 | Nakamura | B60R 16/0232 |
| 9,742,486 | B2 * | 8/2017 | Cross | H04B 7/18508 |
| 2010/0117581 | A1 * | 5/2010 | Miwa | H02P 29/032 318/472 |
| 2012/0262130 | A1 * | 10/2012 | Nakajima | H02P 9/107 322/34 |
| 2013/0147407 | A1 | 6/2013 | Kawamura | |

FOREIGN PATENT DOCUMENTS

| JP | 2003-154952 A | 5/2003 |
| JP | 2008-061180 A | 3/2008 |
| JP | 2012-196054 A | 10/2012 |
| JP | 2013-219980 A | 10/2013 |
| JP | 2015-055981 A | 3/2015 |

* cited by examiner

Primary Examiner — Scott Bauer
(74) Attorney, Agent, or Firm — Posz Law Group, PLC (57) ABSTRACT

When a temperature is less than a first threshold, a protection circuit unit executes a normal operation by a pulse width modulation. When the temperature is greater than or equal to the first threshold and is less than a second threshold, the protection circuit unit executes a first heat dissipation suppressing operation that suppresses a self-heating of a switching element. When the temperature is greater than or equal to the second threshold, the protection circuit unit executes a full off operation that terminates the switching element. When the temperature is decreased to be less than the first threshold and to be greater than or equal to a third threshold after the temperature becomes greater than or equal to the second threshold, the protection circuit unit executes a second heat dissipation suppressing operation that suppresses a heat dissipated due to an energization of the switching element.

7 Claims, 8 Drawing Sheets

OVERHEAT PROTECTION UNIT

CROSS REFERENCE TO RELATED APPLICATION

This application is based on Japanese Patent Application No. 2016-33521 filed on Feb. 24, 2016, the disclosure of which is incorporated herein by reference.

TECHNICAL FIELD

The present disclosure relates to an overheat protection unit protecting an overheat state of a control unit controlling a current flowing through a load by a pulse width modulation.

BACKGROUND

A control unit controls a current flowing through a load that is connected with a switching element by using a pulse width modulation (PWM). In a driving of the load using the PWM, a heat is dissipated due to a switching loss in the switching element. When an abnormal heat dissipation is detected, a fail safe is normally executed to terminate the driving of the load.

However, when the switching element is fully turned off to be in a full off state where a duty ratio is zero in a case where a light load is driven, it is possible that a user becomes uncomfortable due to a sudden lights-out.

According to JP2008-61180A, a load driving control unit executes a control controlling the switching element to be in a fixed full on state, in a case where a temperature abnormal state is detected and the switching element is operating in a normal control. Thus, the heat dissipated due to the switching loss can be suppressed, and the load can be continuously energized.

SUMMARY

However, the load driving control unit in JP2008-61180A functions only when the heat is dissipated due to the switching loss. In other words, in the load driving control unit, since a normal state and an abnormal state are determined according to a single threshold, an overcurrent flows in a full on driving when the heat is not dissipated due to the switching loss. In this case, it is possible that the heat is further dissipated or a damaged is generated due to the switching loss.

It is an object of the present disclosure to provide an overheat protection unit that can execute an overheat protection according to multiple factors.

According to an aspect of the present disclosure, the overheat protection unit includes a switching element controlling a driving current supplied from a power to a load by a pulse width modulation, a driving unit controlling a drive of the switching element, a temperature detection unit directly or indirectly detecting a temperature of the switching element, and a protection circuit unit changing a driving type of the driving unit based on the temperature detected by the temperature detection unit. The protection circuit unit previously sets three thresholds that are predetermined relative to the temperature, the three thresholds include a first threshold, a second threshold that is greater than the first threshold, and a third threshold that is less than the first threshold. When the temperature detected by the temperature detection unit is less than the first threshold, the protection circuit unit controls to execute a normal operation by the pulse width modulation. When the temperature is greater than or equal to the first threshold and is less than the second threshold, the protection circuit unit controls to execute a first heat dissipation suppressing operation that suppresses a self-heating of the switching element. When the temperature is greater than or equal to the second threshold, the protection circuit unit controls to execute a full off operation that terminates the switching element. When the temperature is decreased to be less than the first threshold and to be greater than or equal to the third threshold after the temperature becomes greater than or equal to the second threshold, the protection circuit unit controls to execute a second heat dissipation suppressing operation that suppresses a heat dissipated due to an energization of the switching element.

Thus, it is possible that the heat is dissipated due to a switching loss in a case where the temperature is greater than or equal to the first threshold, an operation suppressing the self-heating of the switching element can be executed. When the temperature is greater than or equal to the second threshold, it is possible that the heat is not dissipated due to the switching loss, and an energization of the switching element is terminated. Since the second heat dissipation suppressing operation is executed in a case where the temperature is decreased to be less than the first threshold and to be greater than or equal to the third threshold after the temperature becomes greater than or equal to the second threshold, a chattering can be prevented between the first heat dissipation suppressing operation and the normal operation.

The overheat protection unit uses the three thresholds including the first threshold, the second threshold, and the third threshold as thresholds controlling operations relative to temperature. Thus, the chattering can be prevented and an overheat protection can be executed according to multiple factors.

BRIEF DESCRIPTION OF THE DRAWINGS

The above and other objects, features and advantages of the present disclosure will become more apparent from the following detailed description made with reference to the accompanying drawings. In the drawings.

DESCRIPTION OF EMBODIMENTS

Embodiments of the present disclosure will be described hereafter referring to drawings. In the embodiments, a part that corresponds to a matter described in a preceding embodiment may be assigned with the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

Hereafter, referring to drawings, an embodiment of the present disclosure will be described. In addition, the substantially same parts and components are indicated with the same reference numeral in following drawings. When only a part of a configuration in each embodiment is described, the other parts of the configuration can be configured as the same as a prior embodiment. Further, it is to be understood that the disclosure is not limited to the embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

First Embodiment

Figure 1:
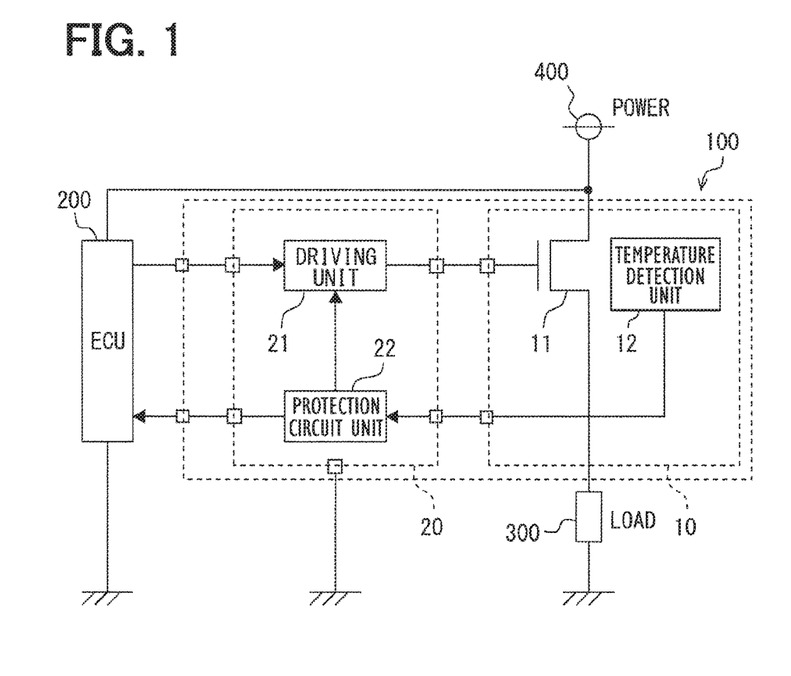
FIG. 1 is a block diagram showing an outline of an overheat protection unit according to a first embodiment of the present disclosure.

Referring to FIG. 1, an overheat protection unit 100 according to a first embodiment of the present disclosure will be described.

The overheat protection unit 100 is a unit controlling a driving current that drives a load 300. As shown in FIG. 1, the overheat protection unit 100 is interposed between an ECU 200 that is a control unit outputting an instruction controlling the driving current and the load 300. According to the present embodiment, the driving current is supplied from the power 400 to the load 300.

The overheat protection unit 100 includes a switching element 11 connected between a power 400 and the load 300, a temperature detection unit 12 arranged in the vicinity of the switching element 11, a driving unit 21 controlling an on or off of the switching element 11 by outputting a driving signal to the switching element 11, and a protection circuit unit 22 controlling the driving unit 21 to execute an overheat protection control. According to the present embodiment, the driving unit 21 controls a drive of the switching element 11, and the protection circuit unit 22 changes a driving type of the driving unit 21. The overheat protection unit 100 is separated from an element module 10 including the switching element 11 and the temperature detection unit 12 and is separated from a circuit substrate 20 including the driving unit 21 and the protection circuit unit 22. The overheat protection unit 100, the element module 10, and the circuit substrate 20 are connected with each other through a wiring.

The switching element 11 may use an element that is turned on or turned off when the driving signal is inputted. According to the present disclosure, the switching element 11 may use a MOSFET or an IGBT. As shown in FIG. 1, the switching element 11 is indicated as a MOSFET. However, the switching element 11 is not limited to the MOSFET.

The temperature detection unit 12 is an element converting a temperature to a voltage. According to the present disclosure, the temperature detection unit 12 may use a thermistor or a PN junction diode. According to the present embodiment, the temperature detection unit 12 is arranged in the vicinity of the switching element 11. The temperature detection unit 12 can detect at least a temperature Tj of the switching element 11. In addition, the temperature detection unit 12 in the present embodiment may be used to detect physical amounts other than the temperature.

The driving unit 21 outputs the driving signal to the switching element 11, based on a pulse width modulation signal (PWM signal) inputted from the ECU 200. According to the present disclosure, the driving signal may be a gate voltage. In other words, the driving unit 21 outputs the driving signal by a pulse width modulation (PWM).

The protection circuit unit 22 is a member requesting a change of a driving mode of the switching element 11 to the driving unit 21 based on the temperature detected by the temperature detection unit 12. The protection circuit unit 22 previously stores three thresholds relative to the temperature. The three thresholds include a first threshold A, a second threshold B, and a third threshold C. The protection circuit unit 22 compares the temperature detected by the temperature detection unit 12 with each of the three thresholds, and then determines the operation mode of the switching element 11. The first threshold A is less than the second threshold B and is greater than the third threshold C. That is, the three thresholds have a magnitude correlation satisfying C<A<B.

Figure 2:
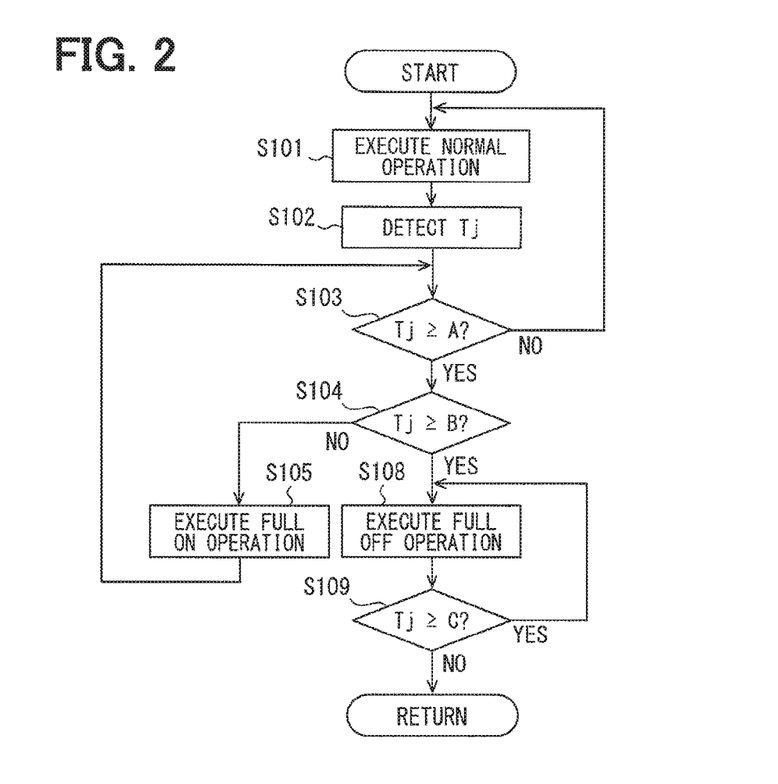
FIG. 2 is a flowchart showing an operation of a protection circuit unit.
Figure 3:
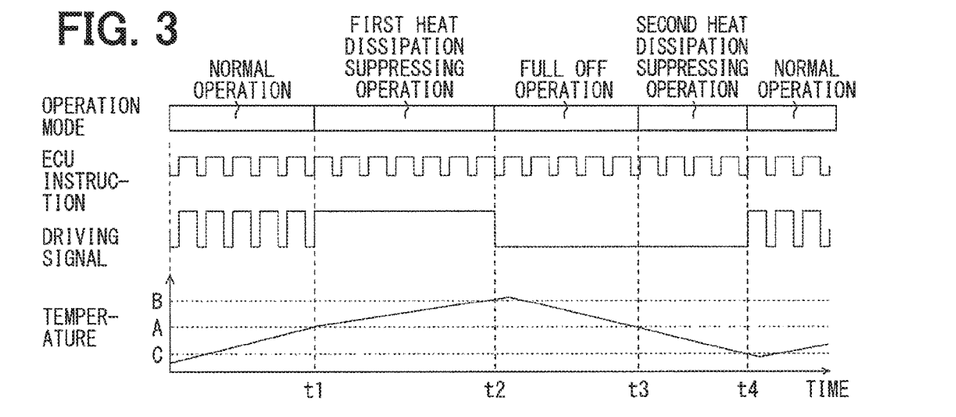
FIG. 3 is a time chart showing a relationship between an operation mode, an ECU instruction, a driving signal, a temperature, and time.

Referring to FIGS. 2 and 3, an operation of the overheat protection unit 100, and a relationship between each threshold of the three thresholds and the operation mode of the switching element 11 will be described.

As shown in FIG. 2, the ECU 200 executes the operation of the overheat protection unit 100. At S101, the driving unit 21 receives the PWM signal from the ECU 200, and outputs a pulse signal as the driving signal based on the PWM signal. Specifically, the driving signal is a pulse signal having a frequency and a duty ratio which are same as a frequency and a duty ratio of the PWM signal, as a time interval before a time point t1 shown in FIG. 3. When the driving unit 21 outputs the pulse signal having the frequency and the duty ratio which are same as the frequency and the duty ratio of the PWM signal as the driving signal, the switching element 11 operates in a normal operation. In other words, at S101, the driving unit 21 controls the switching element 11 to operate in the normal operation.

At S102, the temperature detection unit 12 detects the temperature Tj of the switching element 11. In this case, a physical quantity in one-to-one correspondence with the temperature detected by the temperature detection unit 12 is inputted to the protection circuit unit 22. According to the present embodiment, the physical quantity is a voltage, and the protection circuit unit 22 uses the voltage as the temperature Tj.

At S103, the protection circuit unit 22 compares the temperature Tj with the first threshold A. Specifically, the protection circuit unit 22 determines whether the temperature Tj is greater than or equal to the first threshold A. For example, when a present time is a time point before the time point t1 shown in FIG. 3, the temperature Tj is less than the first threshold A (Tj<A). In this case, at S103, a result becomes a negative determination (S103: No), and the protection circuit unit 22 returns to S101. In other words, when the result of S103 becomes a negative determination (S103: No), the normal operation and a detection of the temperature Tj are repeatedly continued.

When the present time is a time point between the time point t1 and a time point t2 shown in FIG. 3, the temperature Tj is greater than or equal to the first threshold A (Tj A). In this case, the result of S103 becomes a positive determination (S103: Yes), and the protection circuit unit 22 proceeds to S104. At S104, the protection circuit unit 22 compares the temperature Tj with the second threshold B. Specifically, the protection circuit unit 22 determines whether the temperature Tj is greater than or equal to the second threshold B. When the present time is a time point between the time point t1 and the time point t2 shown in FIG. 3, the temperature Tj is less than the second threshold B (Tj<B). In this case, a result of S104 becomes a negative determination (S104: No), and the protection circuit unit 22 proceeds to S105.

At S105, the protection circuit unit 22 controls the driving unit 21 to maintain the driving signal to be a high level. Thus, as shown in FIG. 3, the driving unit 21 outputs the driving signal at the high level without respect to the PWM signal inputted to the driving unit 21, so as to drive the switching element 11 to operate in a full on operation where the switching element 11 is always turned on. According to the present disclosure, the full on operation is a first heat dissipation suppressing operation. In the first heat dissipation suppressing operation, a self-heating of the switching element 11 is suppressed. Since a switching operation of the switching element 11 is not executed when the switching element 11 operates in the full on operation, a heat dissipated due to a switching loss can be suppressed. According to the present disclosure, the switching loss is a loss generated when the switching element 11 operates in the switching operation.

Then, the protection circuit unit 22 returns to S103. Since the full on operation is executed at S105 when an increase of the temperature Tj is generated due to the switching operation, the temperature Tj is decreased, and the result of S103 can become a negative determination (S103: No). In this case, when the result of S103 becomes a negative determination (S103: No), the protection circuit unit 22 returns to S101, and the switching element 11 operates in the normal operation.

When the increase of the temperature Tj is not generated due to the switching operation and when the full on operation is executed at S105 after the time point t1 shown in FIG. 3, the temperature Tj may be continuously increased. When a state that the temperature Tj is greater than or equal to the first threshold A (Tj≥A) is continued, the result of S103 becomes a positive determination (S103: Yes), and the protection circuit unit 22 proceeds to S104.

At S104, when the temperature Tj is less than the second threshold B (Tj<B), the protection circuit unit 22 proceeds to S105, and the full on operation is continued. In this case, when the temperature Tj is still continuously increased, the temperature Tj may be greater than or equal to the second threshold B (Tj B) as the time point t2 shown in FIG. 3, and the result of S104 becomes a positive determination (S104: Yes). When the result of S104 becomes a positive determination (S104: Yes), the protection circuit unit 22 proceeds to S108. At S108, the protection circuit unit 22 controls the driving unit 21 to maintain the driving signal to be a low level. Thus, as shown in FIG. 3, the driving unit 21 outputs the driving signal at the low level without respect to the PWM signal inputted to the driving unit 21, so as to drive the switching element 11 to operate in a full off operation where the switching element 11 is always turned off. In the full off operation in a time interval from the time point t2 to a time point t4 shown in FIG. 3, the switching element 11 is terminated, the switching operation is not executed, and the heat is not electrically dissipated.

At S109, the protection circuit unit 22 compares the temperature Tj with the third threshold C. Specifically, the protection circuit unit 22 determines whether the temperature Tj is greater than or equal to the third threshold C. When the temperature Tj is greater than or equal to the third threshold C (Tj C), a result of S109 becomes a positive determination (S109: Yes), and the protection circuit unit 22 returns to S108 to continue the full off operation. When the temperature Tj is not decreased and is still greater than or equal to the third threshold C (Tj C) even though the full off operation is continued, an ambient temperature of a space where the switching element 11 is arranged at may be greater than a specification temperature. In this case, it is preferable that a system notifying a driver of a state where the ambient temperature is greater than the specification temperature is provided.

When the temperature Tj becomes less than the third threshold C, the result of S109 becomes a negative determination (S109: No), the protection circuit unit 22 returns to S101 to restart the normal operation. In other words, according to the present embodiment, the overheat protection unit 100 continues the full off operation until the temperature Tj becomes less than the third threshold C after the temperature Tj reaches the second threshold B. When the temperature Tj becomes less than the third threshold C, the overheat protection unit 100 returns the operation mode of the switching element 11 to the normal operation. In addition, according to the present embodiment, the overheat protection unit 100 continues the full off operation without executing the normal operation even though the temperature Tj is decreased to the first threshold A after the temperature Tj reaches the second threshold B. Thus, a chattering that repeatedly switching between the full off operation and the normal operation at the first threshold A that is a boundary value.

According to the present disclosure, the full off operation in a time interval from a time point t3 to the time point t4 shown in FIG. 3 is a second heat dissipation suppressing operation. In other words, according to the present embodiment, the second heat dissipation suppressing operation is equivalent to the full off operation.

As the above description, when the temperature Tj of the switching element 11 is increased to be greater than or equal to the first threshold A, the overheat protection unit 100 switches the operation mode from the normal operation to the first heat dissipation suppressing operation that is the full on operation by considering the heat dissipated due to the switching loss. Then, when the temperature Tj is further increased to be greater than or equal to the second threshold B, the overheat protection unit 100 switches the operation mode to the full off operation by considering a condition that the ambient temperature is excessively high or a condition that the heat is dissipated by an energization independent from the switching operation. In other words, the overheat protection unit 100 can execute an overheat protection according to heat dissipation factors.

According to the first embodiment, the protection circuit unit 22 returns to S103 after S105. However, in this case, another operation that compares the temperature Tj with the third threshold C may be executed between S105 and S103.

Figure 4:
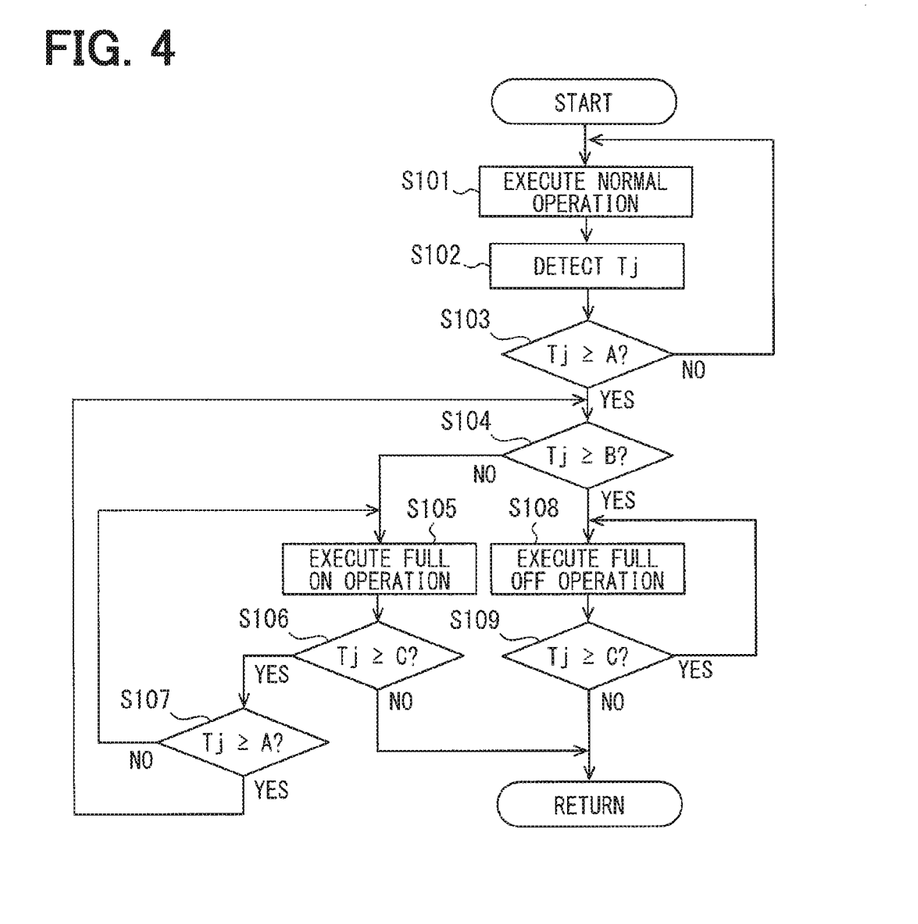
FIG. 4 is a flowchart showing the operation of the protection circuit unit according to a modification example.

Specifically, as shown in FIG. 4, the protection circuit unit 22 proceeds to S106 after S105. At S106, the protection circuit unit 22 compares the temperature Tj with the third threshold C. Specifically, the protection circuit unit 22 determines whether the temperature Tj is greater than or equal to the third threshold C. When the temperature Tj becomes less than the threshold C (Tj<C), a result of S106 becomes a negative determination (S106: No), the protection circuit unit 22 returns to S101 to continue the normal operation.

When the full on operation is executed at S105 and then the temperature Tj is decreased to be less than the third threshold C, it is assumed that the heat dissipated due to the switching loss causes that the temperature Tj becomes greater than or equal to the first threshold A at S103. The protection circuit unit 22 returns the operation mode of the switching element 11 to the normal operation after S106. However, it is preferable that a system notifying the driver of a state where the heat dissipation causes that the temperature Tj becomes greater than or equal to the first threshold A is provided.

As a time interval from the time point t1 to the time point t2 shown in FIG. 3, when the temperature Tj becomes greater than or equal to the third threshold C (Tj≥C), the result of S106 becomes a positive determination (S106: Yes), and the protection circuit unit 22 proceeds to S107. At S107, the protection circuit unit 22 compares the temperature Tj with the first threshold A. Specifically, the protection circuit unit 22 determines whether the temperature Tj is greater than or equal to the first threshold A. When the temperature Tj is less than the first threshold A (Tj<A), a result of S107 becomes a negative determination (S107: No). In this case, the temperature Tj is less than the first threshold A and is greater than or equal to the third threshold C (C≤Tj<A). Then, the protection circuit unit 22 returns to S105 to continue the full on operation. When the temperature Tj is greater than or equal to the first threshold A, the protection circuit unit 22 returns to S104.

Second Embodiment

Figure 5:
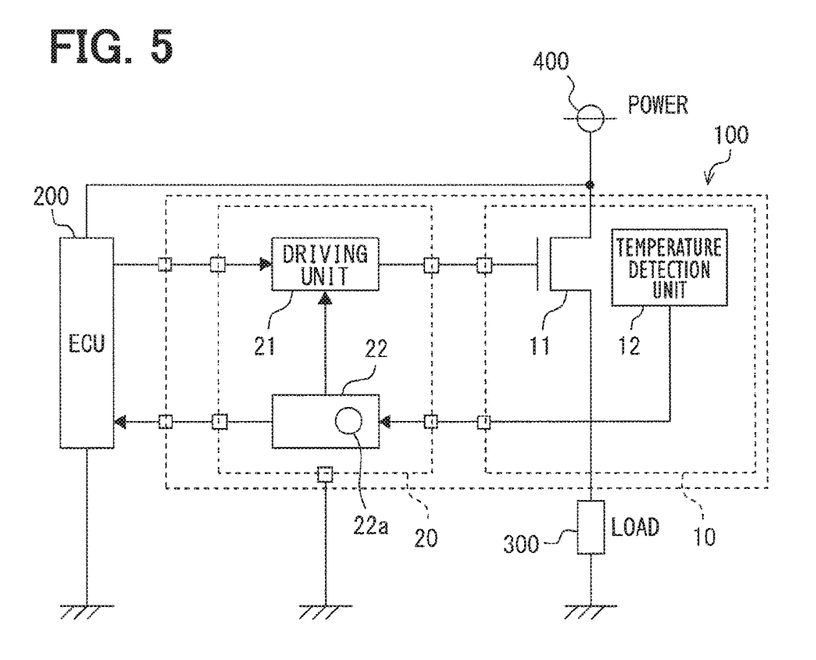
FIG. 5 is a block diagram showing an outline of the overheat protection unit according to a second embodiment of the present disclosure.

A second embodiment of the present disclosure has features different from the first embodiment and the modification example of the first embodiment. In the second embodiment, another state of the first heat dissipation suppressing operation will be described. According to the present embodiment, as shown in FIG. 5, the protection circuit unit 22 includes a counter 22a that counts a total number N of the full on operations executed in a case where the temperature Tj of the switching element 11 is increased from a low temperature state that the temperature Tj is less than the first threshold A to a state that the temperature Tj is greater than or equal to the first threshold A. The overheat protection unit 100 controls the driving signal for the first heat dissipation suppressing operation according to the total number N counted by the counter 22a. According to the present embodiment, the total number N is also referred to as a counting value N.

Figure 6:
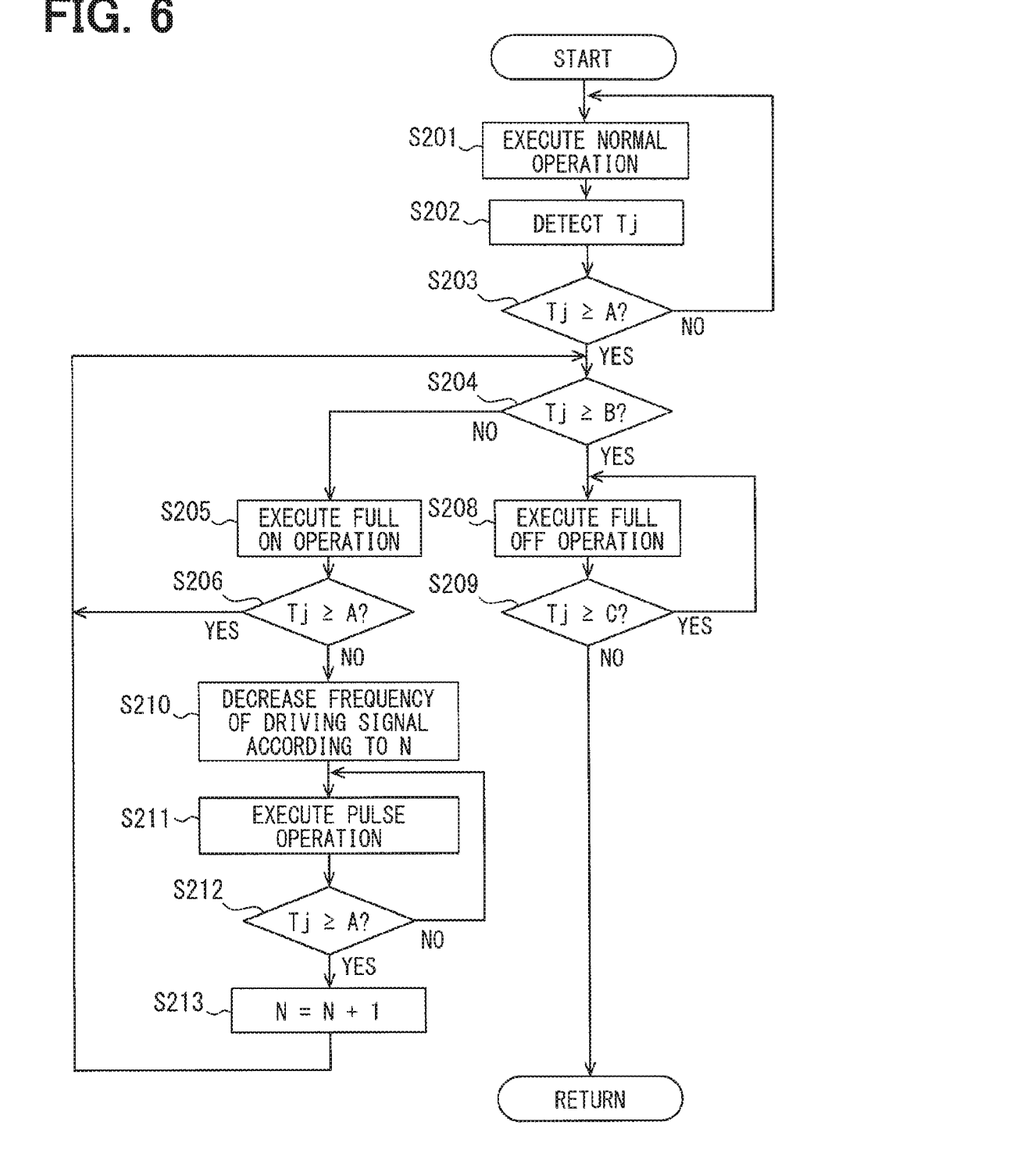
FIG. 6 is a flowchart showing the operation of the protection circuit unit.
Figure 7:
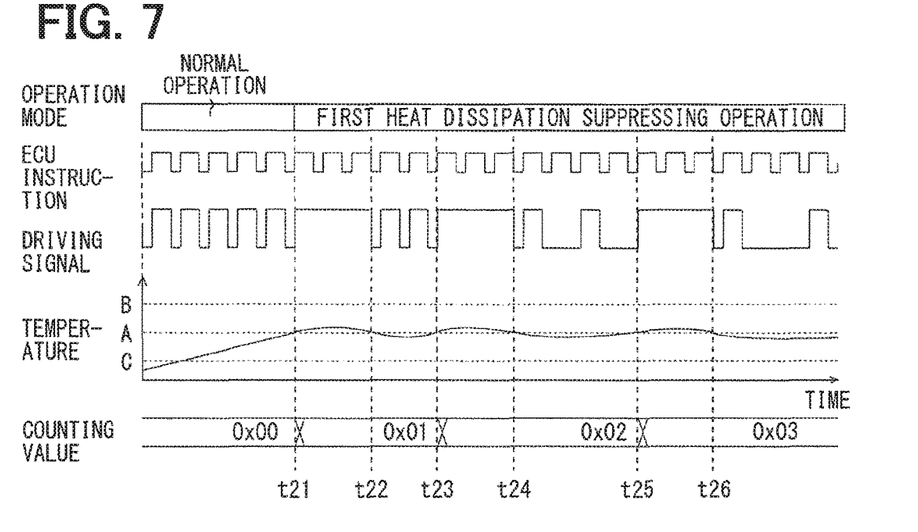
FIG. 7 is a time chart showing a relationship between the operation mode, the ECU instruction, the driving signal, the temperature, a count number, and time.

Referring to FIGS. 6 and 7, the operation of the overheat protection unit 100 will be described. S201 to S204 shown in FIG. 6 are same as S101 to S104 in the first embodiment, and the descriptions of which are omitted. When the temperature Tj of the switching element 11 becomes greater than or equal to the second threshold B, a result of S204 becomes a positive determination (S204: Yes). In this case, S208 and S209 are executed. Since S208 and S209 are also same as S108 and S109 in the first embodiment, the descriptions of which are omitted.

As a time interval from a time point t21 to a time point t22 shown in FIG. 7, when the temperature Tj of the switching element 11 becomes greater than or equal to the first threshold A, a result of S203 becomes a positive determination (S203: Yes), and the protection circuit unit 22 proceeds to S204. When the temperature Tj becomes less than the second threshold B, the result of S204 becomes a negative determination (S204: No), and the protection circuit unit 22 proceeds to S205. In other words, when the temperature Tj is less than the second threshold B and is greater than or equal to the first threshold A (A≤Tj<B), the protection circuit unit 22 proceeds to S205. At S205 that is same as S105 in the first embodiment, the protection circuit unit 22 controls the driving unit 21 to maintain the driving signal to be the high level. In other words, the switching element 11 operates in the full on operation.

At S206, the protection circuit unit 22 compares the temperature Tj with the first threshold A. Specifically, the protection circuit unit 22 determines whether the temperature Tj is greater than or equal to the first threshold A. When the temperature Tj becomes greater than or equal to the first threshold A, a result of S206 becomes a positive determination (S206: Yes), and the protection circuit unit 22 returns to S204. Then, when the temperature Tj becomes greater than or equal to the second threshold B, it is possible that the heat is not dissipated due to the switching loss, and the protection circuit unit 22 proceeds to S208.

When the temperature Tj becomes less than the first threshold A (Tj<A), the result of S206 becomes a negative determination (S206: No), and the protection circuit unit 22 proceeds to S210. In this case, as the time interval from the time point t21 to the time point t22 shown in FIG. 7, a heating of the switching element 11 is terminated by switching from the normal operation to the full on operation, and the temperature Tj is decreased. Then, when the temperature Tj becomes less than the first threshold A (Tj<A) at the time point t22, the protection circuit unit 22 proceeds to S210.

At S210, the protection circuit unit 22 controls the driving unit 21 to decrease a frequency of the driving signal according to the counting value N. Specifically, as a time interval from a time point t24 to a time point t25 or a time interval after a time point t26 shown in FIG. 7, the protection circuit unit 22 controls the driving unit 21 to generate the driving signal having multiple pulses and omission parts. In this case, the driving signal having the omission part includes edges which do not match edges of the PWM signal inputted from the ECU 200 to the driving unit 21. In other words, when the omission parts are replaced by pulses in the driving signal, the driving signal includes edges which match the edges of the PWM signal. According to the present embodiment, in the time interval after the time point t26, the present time is a time point after the time point t26. According to the present embodiment, at S210, the driving signal in the time interval from the time point t24 to the time point t25 has a frequency that is one half of the frequency of the driving signal in the normal operation. Further, the driving signal in the time interval after the time point t26 has a frequency that is one third of the frequency of the driving signal in the normal operation. In other words, at S210, a duty ratio of pluses is decreased without changing a length of the time interval from the time point t24 to the time point t25 or a length of the time interval after the time point t26.

According to the present embodiment, when S210 is executed for the first time (N=0x00), the frequency is not changed, and the protection circuit unit 22 proceeds to S211. The counting value N is increased at S213.

At S211, the driving unit 21 outputs the driving signal according to the frequency changed at S210. As a time interval from the time point t22 to a time point t23 shown in FIG. 7, the driving unit 21 cancels the full on operation of the switching element 11 and switches to a pulse operation. As the above description, after S210 is executed for the first time, the frequency of the driving signal is same as a frequency of that in the normal operation.

At S212, the protection circuit unit 22 compares the temperature Tj with the first threshold A. Specifically, the protection circuit unit 22 determines whether the temperature Tj is greater than or equal to the first threshold A. As the time interval from the time point t22 to the time point t23 shown in FIG. 7, when the temperature Tj becomes less than the first threshold A (Tj<A), a result of S212 becomes a negative determination (S212: No), the protection circuit unit 22 returns to S211 to continue the pulse operation. When a heat is dissipated in the pulse operation and when the temperature Tj becomes greater than or equal to the first threshold A as the time point t23 shown in FIG. 7, the result of S212 becomes a positive determination (S212: Yes), the protection circuit unit 22 proceeds to S213. In this case, it is assumed that the switching element 11 is overheated due to the switching operation.

At S213, the counter 22a increases the counting value N by one. At S210, the frequency of the driving signal in the pulse operation is determined according to the counting value N. After S213 is executed, the protection circuit unit 22 returns to S204.

When the counting value N is increased, a condition that a heat dissipation quantity is increased in the pulse operation and then the heat dissipation quantity is decreased in the full on operation is repeatedly executed. According to the present embodiment, since the frequency of the driving signal in the pulse operation is decreased in accordance with an increase in counting value N, the heat dissipation quantity of the switching element 11 can be suppressed as much as possible without completely stopping a load. In this case, when the load is a light of a vehicle, the heat dissipation quantity can be suppressed without turning off the light. Thus, when the element module 10 is replaced, the driver can take the element module 10 to a car dealer without turning off the light at night.

As shown in FIG. 6, the frequency of the driving signal in the pulse operation is decreased every time that the counting value N is increased by one. However, according to the present disclosure, a decreasing ratio of the frequency to the counting value N is optional. For example, the frequency may be reset every time that the counting value N is increased by two. Alternatively, the decreasing ratio may have a nonlinear relation with the counting value N. Alternatively, when the counting value N exceeds a predetermined value, the pulse operation may be switched to the full off operation.

According to the present embodiment, an operation loop including S205, S206, and S210 to S213 is equivalent to the first heat dissipation suppressing operation. S208 is equivalent to the full off operation. The second heat dissipation suppressing operation in the present embodiment is equivalent to an operation continuing the full off operation same as that in the first embodiment.

Third Embodiment

A third embodiment of the present disclosure has features different from the first embodiment. In the third embodiment, another state of the first heat dissipation suppressing operation will be described. A configuration of the overheat protection unit 100 in the third embodiment is same as a configuration of the overheat protection unit 100 in the first embodiment, and a control operation of the overheat protection unit 100 in the third embodiment is different from a control operation of the overheat protection unit 100.

Figure 8:
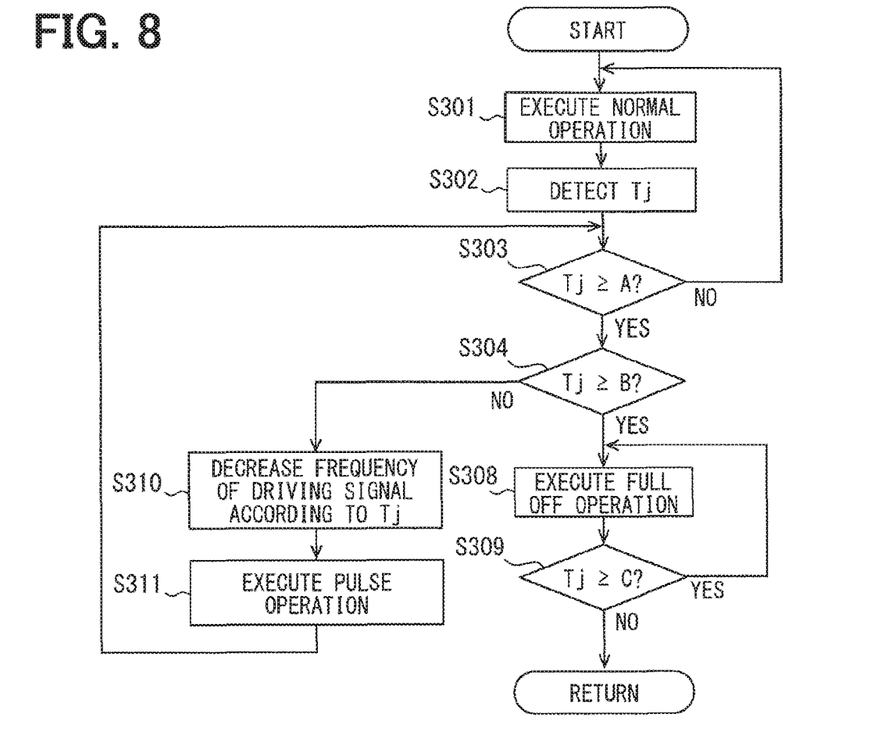
FIG. 8 is a flowchart showing the operation of the protection circuit unit according to a third embodiment of the present disclosure.
Figure 9:
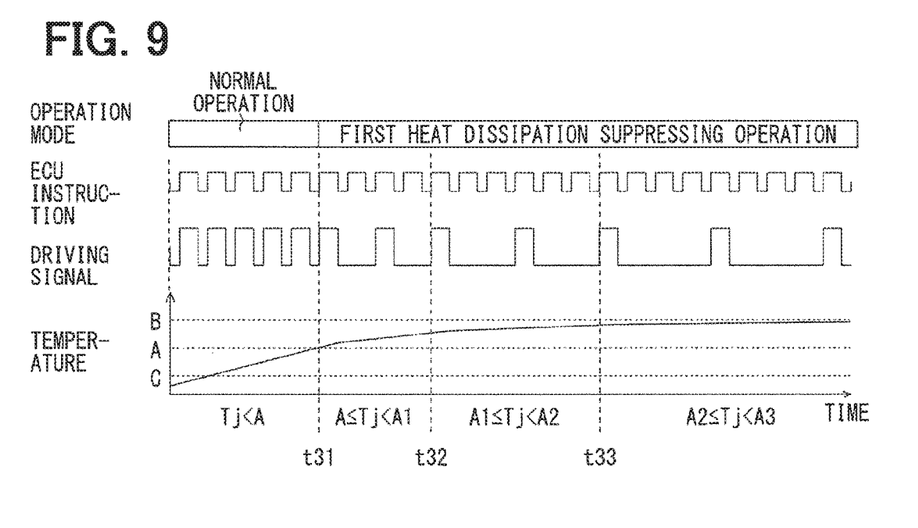
FIG. 9 is a time chart showing a relationship between the operation mode, the ECU instruction, the driving signal, the temperature, and time.

Referring to FIGS. 8 and 9, the operation of the overheat protection unit 100 will be described. S301 to S304 shown in FIG. 8 are same as S101 to S104 in the first embodiment, and the descriptions of which are omitted. When the temperature Tj of the switching element 11 becomes greater than or equal to the second threshold B, a result of S304 becomes a positive determination (S304: Yes). In this case, S308 and S309 are executed. Since S308 and S309 are also same as S108 and S109 in the first embodiment, the descriptions of which are omitted.

When the temperature Tj of the switching element 11 becomes greater than or equal to the first threshold A, a result of S303 becomes a positive determination (S303: Yes), and the protection circuit unit 22 proceeds to S304. When the temperature Tj becomes less than the second threshold B, the result of S304 becomes a negative determination (S304: No), and the protection circuit unit 22 proceeds to S310. In other words, when the temperature Tj is less than the second threshold B and is greater than or equal to the first threshold A (A≤Tj<B), the protection circuit unit 22 proceeds to S310. At S310, the protection circuit unit 22 controls the driving unit 21 to decrease the frequency of the driving signal according to the temperature Tj that is obtained. Specifically, the present time is a time point after a time point t31 shown in FIG. 9, the protection circuit unit 22 controls the driving unit 21 to generate the driving signal having multiple pulses and omission parts. In this case, the driving signal having the omission part includes edges which do not match edges of the PWM signal inputted from the ECU 200 to the driving unit 21. In other words, when the omission parts are replaced by pulses in the driving signal, the driving signal includes edges which match the edges of the PWM signal. At S311, the driving unit 21 controls the switching element 11 to operate in the pulse operation according to an instruction of the protection circuit unit 22.

According to the present embodiment, a fourth threshold A1, a fifth threshold A2, and a sixth threshold A3 are set to be greater than the first threshold A and be less than the second threshold B. The fifth threshold A2 is less than the sixth threshold A3 and is greater than the fourth threshold A1. That is, the first threshold A, the second threshold B, the fourth threshold A1, the fifth threshold A2, and the sixth threshold A3 have a magnitude correlation satisfying A<A1<A2<A3<B. When the present time is a time point before the time point t31, the temperature Tj is less than the first threshold A (Tj<A). In this case, the result of S303 becomes a negative determination (S303: No), and the driving unit 21 controls the switching element 11 to operate in the normal operation. As a time interval from the time point t31 to a time point t32 shown in FIG. 9, when the temperature Tj becomes less than the fourth threshold A1 and becomes greater than or equal to the first threshold A (A≤Tj<A1), the result of S303 becomes a positive determination, and the protection circuit unit 22 proceeds to S304 and S310. At S310, the protection circuit unit 22 controls the driving unit 21 to output the driving signal having a frequency that is one half of the frequency of the driving signal in the normal operation. According to the present embodiment, the duty ratio of pluses is decreased without changing a length of the time interval from the time point t31 to the time point t32 or a length of a time interval from the time point t32 to a time point t33 or a length of a time interval after a time point t33 shown in FIG. 9. As the time interval from the time point t32 to the time point t33 shown in FIG. 9, when the temperature Tj becomes less than the fifth threshold A2 and becomes greater than or equal to the fourth threshold A1 (A1≤Tj<A2), the protection circuit unit 22 controls the driving unit 21 to output the driving signal having a frequency that is one third of the frequency of the driving signal in the normal operation. Similarly, as the time interval after the time point t33 shown in FIG. 9, when the temperature Tj becomes less than the sixth threshold A3 and becomes greater than or equal to the fifth threshold A2 (A2≤Tj<A3), the protection circuit unit 22 controls the driving unit 21 to output the driving signal having a frequency that is one third of the frequency of the driving signal in the normal operation. As shown in FIG. 9, an increasing rate of the temperature Tj of the switching element 11 decreases in accordance with a decrease in driving frequency of the switching element 11. According to the present embodiment, the driving frequency is equivalent to the frequency of the driving signal.

When an element temperature Tj becomes less than the first threshold A in a case where the driving frequency of the switching element 11 is decreased at S310 and S311, the result of S303 becomes a negative determination (S303: No), the switching element 11 operates in the normal operation. When the temperature Tj of the switching element 11 becomes greater than or equal to the second threshold B (Tj≥B) in a case where the driving frequency of the switching element 11 is decreased at S310 and S311 the result of S304 becomes a positive determination, and the protection circuit unit 22 proceeds to S308 to control the switching element 11 to operate in the full off operation by controlling the driving unit 21. According to the present embodiment, the element temperature Tj is the temperature Tj of the switching element 11.

As same as the overheat protection unit 100 in the second embodiment, the overheat protection unit 100 according to the present embodiment can suppress the heat dissipation quantity of the switching element 11 as much as possible without completely stopping a load.

According to the present embodiment, an operation loop including S310 and S311 is equivalent to the first heat dissipation suppressing operation. S308 is equivalent to the full off operation. The second heat dissipation suppressing operation in the present embodiment is equivalent to an operation continuing the full off operation same as that in the first embodiment.

Fourth Embodiment

Figure 10:
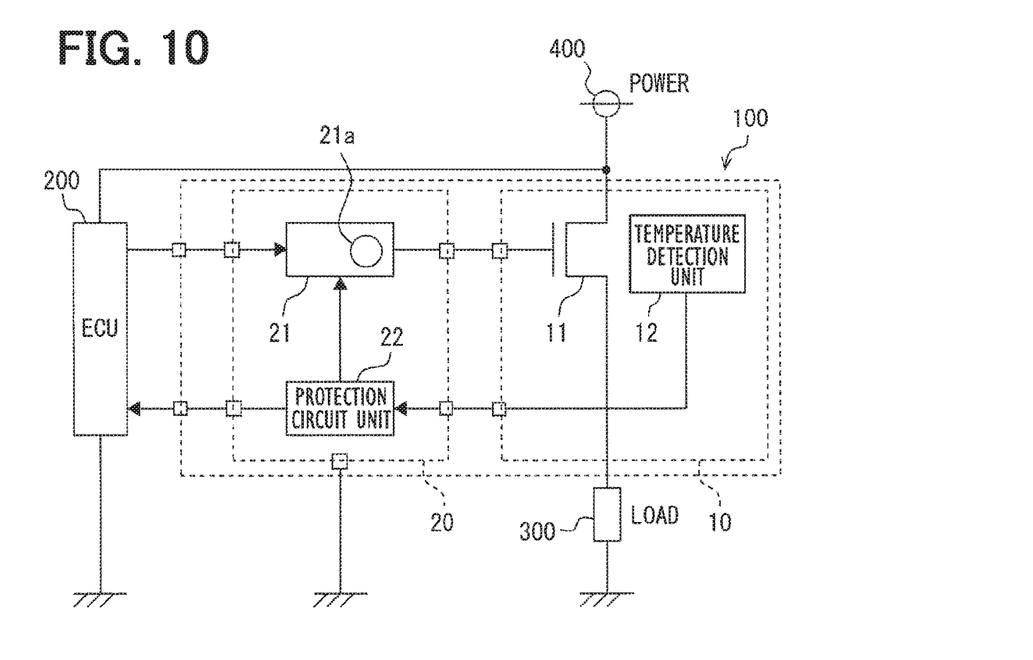
FIG. 10 is a block diagram showing an outline of the overheat protection unit according to a fourth embodiment of the present disclosure.

In the overheat protection unit 100 according to a fourth embodiment of the present disclosure, as shown in FIG. 10, the driving unit 21 includes a drivability changing unit 21a changing a drivability of the driving signal. Usually, the driving signal is set to intentionally ensure a rising time Tr and a falling time Tf for a predetermined time, so as to suppress a radio noise. The switching loss increases in accordance with an increase in lengths of the rising time Tr and the falling time Tf. In other words, a generation of the radio noise and the switching loss have a trade-off relationship.

Figure 11:
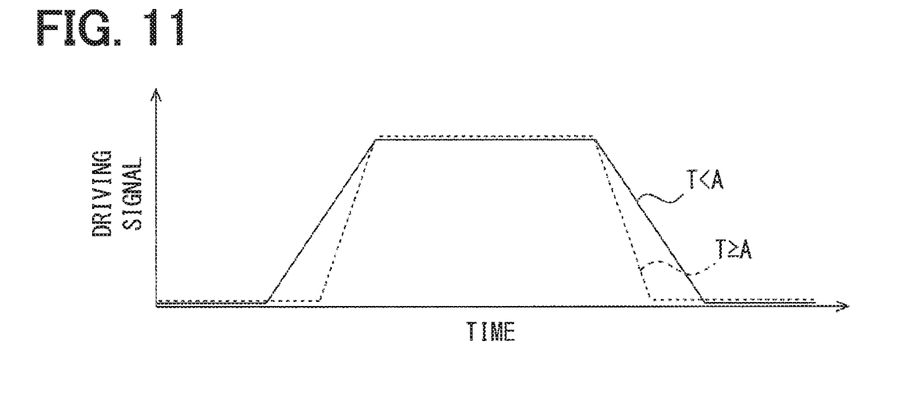
FIG. 11 is a graph showing a relationship between the driving signal and time.

According to the present embodiment, when the temperature Tj detected by the temperature detection unit 12 becomes greater than or equal to the first threshold A, the protection circuit unit 22 changes the drivability of the driving signal to further shorten the rising time Tr and the falling time Tf, as shown in FIG. 11. Thus, the heat dissipation quantity generated due to the switching loss can be suppressed.

According to the present embodiment, it is effective that the drivability changing unit 21a based on a combination of the second embodiment and the third embodiment, in the first heat dissipation suppressing operation where the temperature Tj of the switching element 11 is greater than or equal to the first threshold A.

According to the present embodiment, the drivability changing unit 21a may change a value of a charging current flowing through a charge pump connected to a gate electrode of the switching element 11. Alternatively, the drivability changing unit 21a may change the rising time Tr and the falling time Tf by using a damping resistor or a capacity.

Fifth Embodiment

According to the above embodiments, the element temperature Tj detected by the temperature detection unit 12 arranged in the vicinity of the switching element 11 is used to be compared with the first threshold A, the second threshold B, the third threshold C, the fourth threshold A1 the fifth threshold A2, and the sixth threshold A3. However, a temperature other than the element temperature Tj may be used to be compared with the first threshold A, the second threshold B, the third threshold C, the fourth threshold A1, the fifth threshold A2, and the sixth threshold A3. According to the present embodiment, the temperature detection unit 12 is equivalent to a first temperature detection unit 12.

Figure 12:
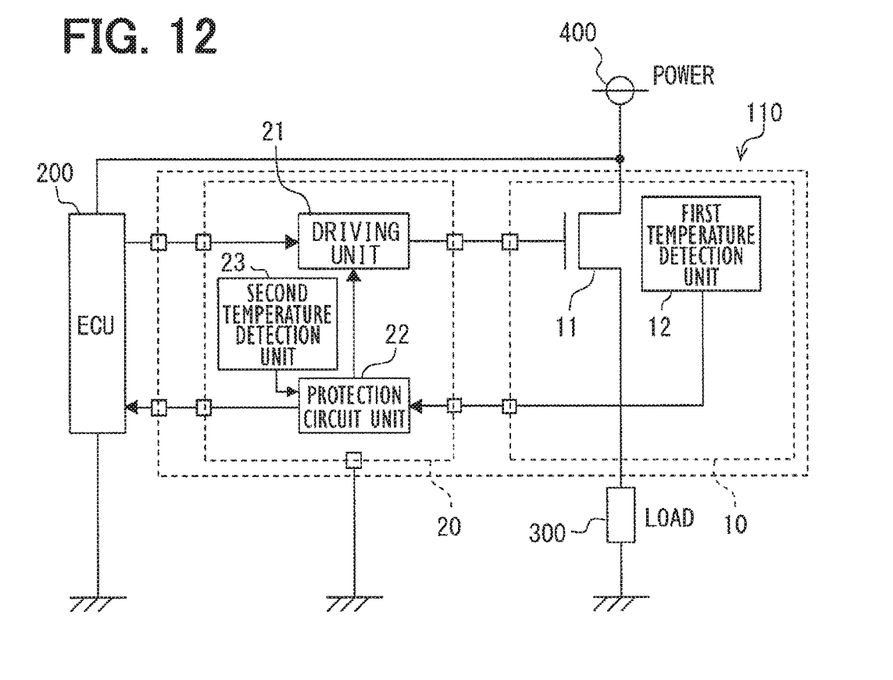
FIG. 12 is a block diagram showing an outline of the overheat protection unit according to a fifth embodiment of the present disclosure.

As shown in FIG. 12, an overheat protection unit 110 according to a fifth embodiment of the present disclosure includes a second temperature detection unit 23 detecting an ambient temperature Ta that is a temperature of an environment where the overheat protection unit 110 is arranged. According to the present embodiment, the second temperature detection unit 23 is attached to the circuit substrate 20. According to the present disclosure, the first temperature detection unit 12 detecting a temperature in the vicinity of the switching element 11 in the first embodiment to the fourth embodiment, the second temperature detection unit 23, or both the first temperature detection unit 12 and the second temperature detection unit are equivalent to a temperature detection unit. The second temperature detection unit 23 indirectly detects the temperature of the switching element 11.

The protection circuit unit 22 executes operations in the first embodiment to the fourth embodiment, based on the element temperature Tj detected by the first temperature detection unit 12 or the ambient temperature Ta detected by the second temperature detection unit 23. The ambient temperature Ta may replace the element temperature Tj to compare with the first threshold A, the second threshold B, the third threshold C, the fourth threshold A1, the fifth threshold A2, and the sixth threshold A3. Since the ambient temperature Ta is generally lower than the element temperature Tj, it is preferable that the element temperature Tj is used to be compared with the second threshold B so as to prevent a heat damage of the switching element 11.

Other Embodiment

The present disclosure is not limited to the embodiments mentioned above, and can be applied to various embodiments within the spirit and scope of the present disclosure.

According to the above embodiments, the full off operation from a time point that the element temperature Tj or the ambient temperature Ta is decreased to be less than the first threshold A after reaching the second threshold B to a time point that the element temperature Tj or the ambient temperature Ta is decreased to be less than the third threshold C is equivalent to the second heat dissipation suppressing operation. However, the second heat dissipation suppressing operation is not limited to the full off operation. For example, when the element temperature Tj or the ambient temperature Ta is in a temperature range from the third threshold C to the first threshold A after the full off operation, a pulse operation including the driving signal having a frequency same as the frequency of the driving signal in the normal operation may be intermittently executed. In this case, when a decreasing rate of the temperature becomes less than a predetermined rate due to the pulse operation, it is preferable that the full off operation is continued to prevent an overheat of the element temperature Tj or the ambient temperature Ta generated due to the switching loss. When the decreasing rate of the temperature is still greater than or equal to the predetermined rate while the pulse operation is intermittently executed, it is assumed that the overheat is generated due to the environment. In this case, the normal operation may be restarted before the element temperature Tj or the ambient temperature Ta becomes the third threshold C.

When the protection circuit unit 22 detects a temperature greater than or equal to the first threshold A as the element temperature Tj or the ambient temperature Ta and when the protection circuit unit 22 detects a temperature greater than or equal to the second threshold B as the element temperature Tj or the ambient temperature Ta, the protection circuit unit 22 may inform the ECU 200 or an external display unit. Thus, the ECU 200 can execute a diagnostics operation when receiving from the protection circuit unit 22. Alternatively, the driver can use the above information to execute a repair.

According to the above embodiments, in the overheat protection unit 100, 110, the element module 10 where the switching element 11 and the temperature detection unit 12 are arranged and the circuit substrate 20 where the driving unit 21 and the protection circuit unit 22 are arranged are independent from each other. However, the switching element 11, the temperature detection units 12, 23, the driving unit 21, and the protection circuit unit 22 may be arranged on one substrate.

The protection circuit unit 22 may be included in the ECU 200. In this case, the temperature detected by the temperature detection units 12, 23 is inputted to the ECU 200, and the instruction generated based on the element temperature Tj or the ambient temperature Ta is outputted from the ECU 200 to the driving unit 21.

What is claimed is:
1. An overheat protection unit comprising:
a switching element controlling a driving current supplied from a power to a load by a pulse width modulation;
a driving unit controlling a drive of the switching element;
a temperature detection unit directly or indirectly detecting a temperature of the switching element; and
a protection circuit unit changing a driving type of the driving unit based on the temperature detected by the temperature detection unit, wherein the protection circuit unit previously sets three thresholds that are predetermined relative to the temperature, the three thresholds include a first threshold, a second threshold that is greater than the first threshold, and a third threshold that is less than the first threshold, when the temperature detected by the temperature detection unit is less than the first threshold, the protection circuit unit controls to execute a normal operation by the pulse width modulation, when the temperature is greater than or equal to the first threshold and is less than the second threshold, the protection circuit unit controls to execute a first heat dissipation suppressing operation that suppresses a self-heating of the switching element, when the temperature is greater than or equal to the second threshold, the protection circuit unit controls to execute a full off operation that terminates the switching element, and when the temperature is decreased to be less than the first threshold and to be greater than or equal to the third threshold after the temperature becomes greater than or equal to the second threshold, the protection circuit unit controls to execute a second heat dissipation suppressing operation that suppresses a heat dissipated due to an energization of the switching element.

2. The overheat protection unit according to claim 1, wherein
the first heat dissipation suppressing operation is a full on operation where the switching element is always turned on.

3. The overheat protection unit according to claim 2, wherein
the protection circuit unit includes a counter counting a counting value of the full on operations executed in a case where the temperature is increased from a state that the temperature is less than the first threshold to a state that the temperature is greater than or equal to the first threshold, and
a driving frequency in the normal operation is decreased in accordance with an increase in counting value.

4. The overheat protection unit according to claim 1, wherein
the first heat dissipation suppressing operation is an operation where a driving frequency of the operation is decreased relative to a driving frequency of the normal operation in accordance with an increase in temperature of the switching element.

5. The overheat protection unit according to claim 1, wherein
in the first heat dissipation suppressing operation, a rising edge and a falling edge of a pulse are sharper than a rising edge and a falling edge of a pulse in the normal operation, respectively.

6. The overheat protection unit according to claim 1, wherein
the second heat dissipation suppressing operation is an operation continuing the full off operation and terminating the switching element.

7. The overheat protection unit according to claim 6, wherein
in the second heat dissipation suppressing operation, the normal operation is intermittently executed.

* * * * *